United States Patent
Takeda

(10) Patent No.: US 8,134,863 B2
(45) Date of Patent: Mar. 13, 2012

(54) SEMICONDUCTOR MEMORY DEVICE

(75) Inventor: Koichi Takeda, Kanagawa (JP)

(73) Assignee: Renesas Electronics Corporation, Kawasaki, Kanagawa (JP)

(*) Notice: Subject to any disclaimer, the term of this patent is extended or adjusted under 35 U.S.C. 154(b) by 0 days.

(21) Appl. No.: 12/923,264

(22) Filed: Sep. 13, 2010

(65) Prior Publication Data

US 2011/0063896 A1 Mar. 17, 2011

(30) Foreign Application Priority Data

Sep. 14, 2009 (JP) ................................. 2009-211544

(51) Int. Cl.
*G11C 11/00* (2006.01)
(52) U.S. Cl. .................... 365/156; 365/154; 365/203
(58) Field of Classification Search ................... 365/154, 365/156, 203, 230.03
See application file for complete search history.

(56) References Cited

U.S. PATENT DOCUMENTS

| | | | | |
|---|---|---|---|---|
| 7,630,273 B2 * | 12/2009 | Suzuki | ..................... | 365/230.05 |
| 2007/0083745 A1 * | 4/2007 | Iwata | ................................ | 713/1 |
| 2009/0207642 A1 * | 8/2009 | Shimano et al. | ................ | 365/72 |

FOREIGN PATENT DOCUMENTS

| JP | 2007-058979 | 3/2007 |
|---|---|---|
| JP | 2008-159669 | 7/2008 |

OTHER PUBLICATIONS

A.Kawasumi et al., "A Single-Power-Supply 0.7V 1GHz 45nm SRAM with An Asymmetrical Unit-β-ratio Memory Cell", 2008 IEEE International Solid-State Circuits Conference, pp. 382, 383, and 622.
Byung-Do Yang et. al., "A Low-Power SRAM Using Hierarchical Bit Line and Local Sense Amplifiers", IEEE Journal of Solid-State Circuits, Jun. 2005, vol. 40, No. 6, pp. 1366 to 1376.

* cited by examiner

*Primary Examiner* — Gene Auduong
(74) *Attorney, Agent, or Firm* — McGinn IP Law Group PLLC

(57) ABSTRACT

A semiconductor device according to the present invention includes a first memory cell array in which a plurality of first memory cells are arranged as a matrix, data being read from or written to the first memory cells, and a second memory cell array in which a plurality of second memory cells amplifying and storing the data of one of the plurality of the first memory cells arranged in a corresponding column are arranged as a matrix. The first memory cell array and the second memory cell array are arranged face to face in the column direction. An area of the second memory cell is larger than that of the first memory cell. An area of the first memory cell array is twice or more as large as that of the second memory cell array.

15 Claims, 16 Drawing Sheets

SEMICONDUCTOR MEMORY DEVICE

INCORPORATION BY REFERENCE

This application is based upon and claims the benefit of priority from Japanese patent application No. 2009-211544, filed on Sep. 14, 2009, the disclosure of which is incorporated herein in its entirety by reference.

BACKGROUND

1. Field of the Invention

The present invention relates to a semiconductor memory device, and more particularly, an arrangement of memory cells.

2. Description of Related Art

In recent years, device variation has been increased in transistors included in an SRAM (Static Random Access Memory) according to miniaturization of a CMOS process. The increase in the device variation causes a problem that memory data is likely to be destroyed in a reading operation in the SRAM. Further, the increase in the device variation causes another problem of a decrease in a reading-rate due to a decrease in a reading current, for example. As a result, a yield ratio of a semiconductor integrated circuit including the SRAM falls. Therefore, a decrease in the device variation by upsizing an SRAM cell is required to keep a certain yield ratio. Thus, this causes a problem of an increase in a circuit scale.

A solution to the above-mentioned problem is provided in "A. Kawasumi et al., "A Single-Power-Supply 0.7V 1 GHz 45 nm SRAM with An Asymmetrical Unit-β-ratio Memory Cell", 2008 IEEE International Solid-State Circuits Conference, pp-382, 383, and 622 (hereinafter, it is referred as Kawasumi)". A semiconductor memory device described in Kawasumi includes a plurality of SRAM control circuits (local reading circuit/local writing circuit) that write data to the SRAM cell or read data from the same. Each of the SRAM control circuits controls a plurality of the SRAM cells connected through a common bit-line pair. An SRAM control circuit and a plurality of the SRAM cells controlled thereby constitute an SRAM cell array. Here, in the semiconductor memory device described in Kawasumi, the number of the SRAM cells controlled by an SRAM control circuit is limited. Practically, the number of the SRAM cells controlled by an SRAM control circuit is sixteen. This makes it possible to decrease a load capacity of each bit-line pair, thereby reducing discharge time of the bit-line pairs in the reading operation.

As a result, the problem of the decrease in the reading-rate due to the decrease in the reading current is solved. Further, the problem that the memory data is likely to be destroyed is also solved. A destruction of the memory data in the reading operation is caused due to an electric charge flow from the bit-line charged at a high-voltage-side power supply VDD into a memory node of the SRAM cell holding a low-level. Thus, if it is possible to quickly transmit the memory data to the bit-line as described in Kawasumi, an amount of electric charge flow from the bit-line into the memory node decreases, and the destruction of the memory data can be prevented.

SUMMARY

Thus, the present inventor has found a fact described below. It is effective to suppress the number of the SRAM cells controlled by an SRAM control circuit and arrange a lot of cell arrays so as to improve a reading operation margin of the semiconductor memory device. In this case, it is required to downsize the SRAM control circuit (local reading circuit/local writing circuit) as small as possible so as to prevent an increase in a scale of the semiconductor memory device. In Kawasumi, a local reading circuit and a local writing circuit include a total of nineteen transistors. The local reading circuit and local writing circuit are commoditized by two SRAM cell arrays. Thus, the number of the transistors of the local reading circuit and local writing circuit corresponding to an SRAM cell array is nine and a half.

Further, another solution to the above-mentioned problem is provided in "Byung-Do Yang et. al., "A Low-Power SRAM Using Hierarchical Bit Line and Local Sense Amplifiers", IEEE JOURNAL OF SOLID-STATE CIRCUITS, June, 2005, VOL. 40, No. 6, pp 1366 to 1376 (hereinafter, it is referred as Byung)". A semiconductor memory device described in Byung includes a local sense amplifier (local reading circuit/local writing circuit) LSA, an access transistor, and a plurality of SRAM cells. The access transistor controls input and output signals of the local sense amplifier LSA. However, there is described nothing about layouts and configurations of the local sense amplifier and SRAM cells. Therefore, a cell occupation ratio of the SRAM cell may fall depending on the layouts and configurations.

Furthermore, another solution to the above-mentioned problem is provided in Japanese Unexamined Patent Application Publication No. 2007-58979. A semiconductor memory device described in Japanese Unexamined Patent Application Publication No. 2007-58979 includes a plurality of memory cells, a word line, a bit-line pair, a global bit-line, a reading support circuit, and a reading unit. The word line and bit-line pair are connected to a plurality of the memory cells. The reading support circuit and reading unit function as a local reading circuit. The reading support circuit controls one of the bit-line pair (first bit-line) at a predetermined voltage based on a control signal to be supplied and the signal from the other of the bit-line pair (second bit-line). The reading unit controls the global bit-line at a predetermined voltage based on the voltage of the first bit-line. However, the reading support circuit and reading unit do not have a writing function. Thus, other control circuit for data writing is required. Therefore, a scale of the semiconductor memory device may increase.

Besides, another solution to the above-mentioned problem is provided in Japanese Unexamined Patent Application Publication No. 2008-159669. A semiconductor memory device described in Japanese Unexamined Patent Application Publication No. 2008-159669 includes a plurality of memory cells and a local reading data amplifier circuit (local reading circuit). The local reading data amplifier circuit is connected to a plurality of memory cells through a bit-line. Here, an N-type well of the local reading data amplifier circuit is connected to N-type wells of the memory cells. This makes it possible to downsize an area and suppress a fall in a yield ratio in manufacturing processes. However, the local reading data amplifier circuit does not have a writing function. Thus, other control circuit for data writing is required. Therefore, a scale of the semiconductor memory device may increase.

As described above, it is effective to suppress the number of the SRAM cells controlled by an SRAM control circuit (local reading circuit/local writing circuit) and arrange a lot of cell arrays so as to improve the reading operation margin of the semiconductor memory device. However, if the area of the local reading circuit/local writing circuit is large as described above, the cell occupation ratio of the SRAM cell falls.

A first exemplary aspect of the present invention is a semiconductor memory device including a first memory cell array in which a plurality of first memory cells are arranged as a matrix, data being read from or written to the first memory cells, and a second memory cell array in which a plurality of a second memory cells amplifying and storing the data of one of the plurality of the first memory cells arranged in a corresponding column are arranged as a matrix. The first memory cell array and the second memory cell array are arranged face to face in the column direction. An area of the second memory cell is larger than that of the first memory cell. An area of the first memory cell array is twice or more as large as that of the second memory cell array.

According to the circuit configuration described above, a fall in data reading precision due to the device variation is suppressed without a fall in a cell occupation ratio of the memory cell.

The present invention can provide a semiconductor memory device capable of suppressing the fall in the data reading precision due to the device variation without the fall in the cell occupation ratio of the memory cell.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
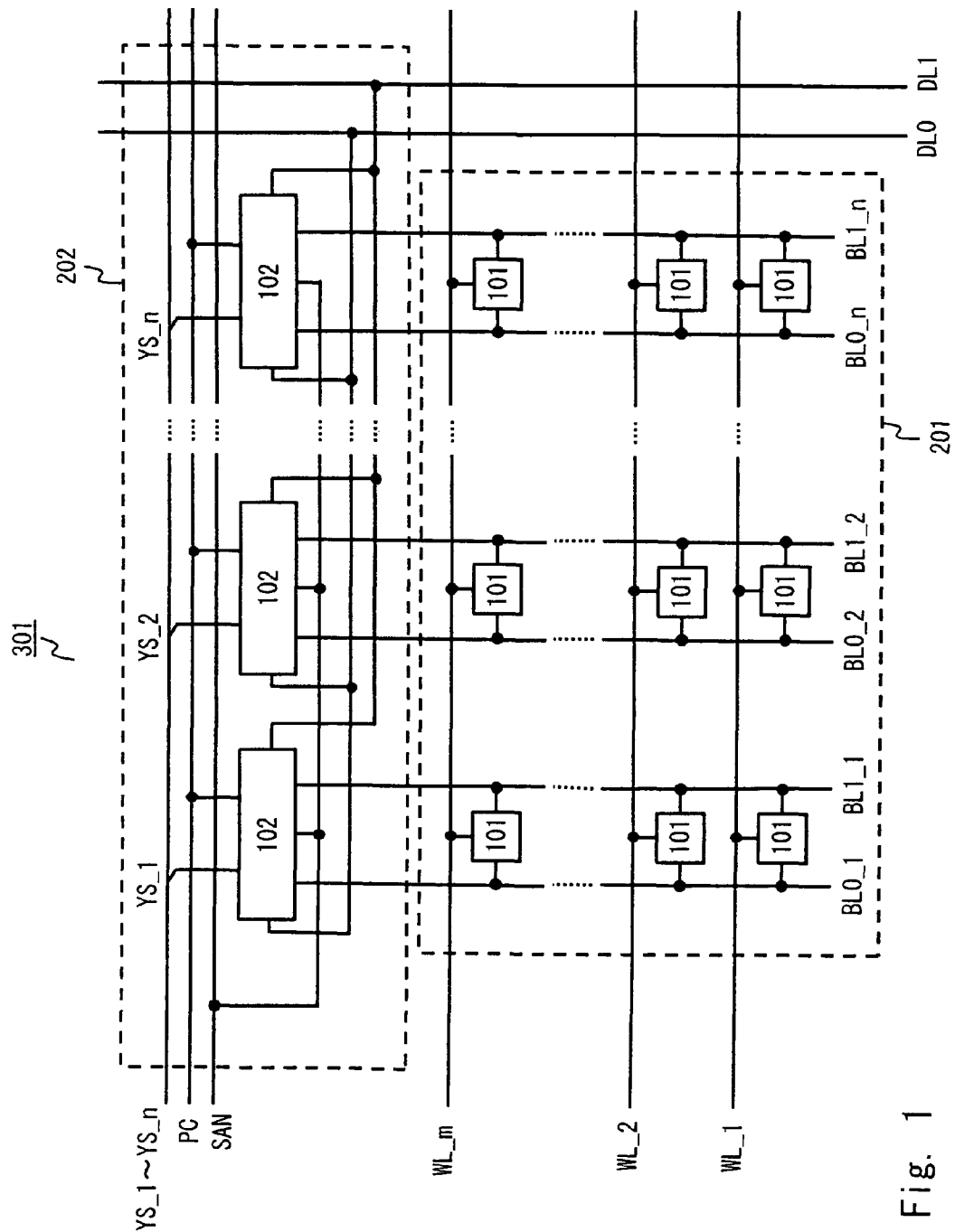
FIG. 1 a block diagram showing a basic configuration of a memory cell array part included in a semiconductor memory device according to a first exemplary embodiment of the present invention.

A specific exemplary embodiment incorporating the present invention is described hereinafter with reference to the drawings. In the drawings, same components are marked with the same reference numerals, and duplicated explanation is omitted as appropriate.

First Exemplary Embodiment

FIG. 1 is a block diagram showing a basic configuration of a memory cell array part 301 included in a semiconductor memory device according to a first exemplary embodiment of the present invention. The memory cell array part 301 of the present invention includes a memory cell array 201 and a memory cell array 202. The memory cell array 201 stores data. The memory cell array 202 passes data between outside and the memory cell array 201. In the memory cell array part 301, a first word line (first control signal) WL, a second word line (second control signal) YS, a sense amplifier enable signal line (forth control signal) SAN, and a pre-charge enable signal line (third control signal) PC are wired in a transverse direction (row direction) in FIG. 1. First bit-line pairs BL0/BL1 (pairs of first bit-lines BL0 and BL1) and a second bit-line pair DL0/DL1 (pair of second bit-lines DL0 and DL1) are wired in a longitudinal direction (column direction) in FIG. 1. M·N (M and N are integers of one or more) first memory cells 101 are arranged as a matrix in the memory cell array 201. N second memory cells 102 are arranged in the row direction in the memory cell array 202. Here, each of "WL", "YS", "BL0_j", "BL1_j", "DL0", and "DL1" represents not only a signal line but also a signal as a matter of convenience.

Next, a circuit configuration of the memory cell array part 301 will be described with reference to FIG. 1. The memory cell array 201 is connected to the M first word lines WL wired in the row direction and the N first bit-line pairs BL0/BL1 wired in the column direction. Hereinafter, the M first word lines WL are distinguished from each other by being described as the first word line WL_i (i is an integer of one to M). The N first bit-lines BL0 are distinguished from each other by being described as the first bit-line BL0_j (j is an integer of one to N). The N first bit-lines BL1 are distinguished from each other by being described as the first bit-line BL1_j. Here, in the M·N first memory cells 101 arranged in the memory cell array 201, the N first memory cells 101 arranged in the i-th row are connected to the first word line WL_i.

The memory cell array 202 is connected to the N second word lines YS wired in the row direction, one sense amplifier enable signal line SAN in the row direction, one pre-charge enable signal line PC wired in the row direction, and one second bit-line pair DL0/DL1 wired in the column direction. Hereinafter, the N second word lines YS are distinguished from each other by being described as the second word line YS_j. Here, in the N second memory cells 102 arranged in the row direction in the memory cell array 202, the second memory cell 102 arranged in the j-th column is connected to the second word line YS_j. Each of the second memory cells 102 is connected to the pre-charge enable signal line PC in common, the second bit-line pair DL0/DL1, and the sense amplifier enable signal line SAN. Further, the pre-charge enable signal line PC, the second bit-line pair DL0/DL1, and the sense amplifier enable signal line SAN are shared by the N second memory cells 102.

The memory cell array 201 is connected to the memory cell array 202 through the first bit-line pairs BL0/BL1. Practically, the second memory cell 102 connected to the second word line YS_j in the memory cell array 202 is connected to the M first memory cells 101 arranged in the j-th column in the memory cell array 201 through the first bit-line pair BL0_j/BL1_j (pair of the first bit-lines BL0_j and BL1_j).

Figure 2:
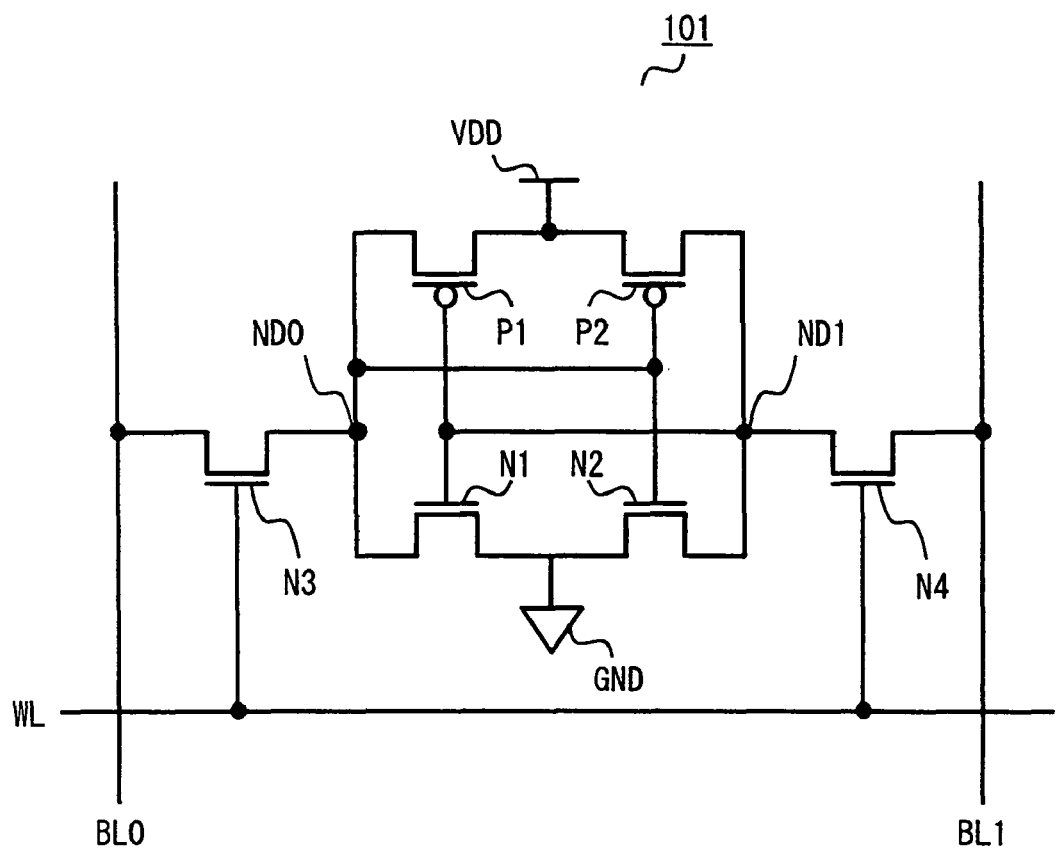
FIG. 2 is a circuit diagram showing a configuration of a first memory cell according to the first exemplary embodiment of the present invention.

FIG. 2 is a circuit diagram showing a configuration of the first memory cell 101. As shown in FIG. 2, the first memory cell 101 is a general memory cell including six transistors. The first memory cell 101 includes NMOS drive transistors N1 and N2, NMOS access transistors N3 and N4, and PMOS load transistors P1 and P2. The first memory cell 101 further includes a high-voltage-side power supply terminal VDD and a low-voltage-side power supply terminal GND. Note that the symbol "VDD" represents not only the name of the terminal but also a high-voltage-side power supply as a matter of convenience. Further, the symbol "GND" represents not only the name of the terminal but also a low-voltage-side power supply as a matter of convenience.

The drain of the NMOS drive transistor N1, the gate of the NMOS drive transistor N2, the drain of the PMOS load transistor P1, the gate of the PMOS load transistor P2, and the drain of the NMOS access transistor N3 are connected to each other through a first memory node ND0 serving as one of a first memory node pair. The gate of the NMOS drive transistor N1, the drain of the NMOS drive transistor N2, the gate of the PMOS load transistor P1, the drain of the PMOS load transistor P2, and the drain of the NMOS access transistor N4 are connected to each other through a first memory node ND1 serving as the other of the first memory node pair. The sources of the NMOS drive transistors N1 and N2 are connected to the low-voltage-side power supply terminal GND. The sources of the PMOS load transistors P1 and P2 are connected to the high-voltage-side power supply terminal VDD. The source of the NMOS access transistor N3 is connected to the first bit-line BL0 serving as one of the first bit-line pair. The gate of the NMOS access transistor N3 is connected to the first word line WL. The source of the NMOS access transistor N4 is connected to the first bit-line BL1 serving as the other of the first bit-line pair. The gate of the NMOS access transistor N4 is connected to the first word line WL.

Here, the NMOS drive transistor N1 and the PMOS load transistor P1 constitute one CMOS inverter circuit. The NMOS drive transistor N2 and the PMOS load transistor P2 constitute the other CMOS inverter circuit. In sum, ON/OFF of currents flowing between the sources and drains of the NMOS drive transistor N1 and the PMOS load transistor P1 is controlled based on a signal to be input to the gates of the NMOS drive transistor N1 and the PMOS load transistor P1. Thus, an inverted signal is output from the drain of the NMOS drive transistor N1 or the drain of the PMOS load transistor P1. The signal to be output from the drain of the NMOS drive transistor N1 or the drain of the PMOS load transistor P1 is input to the gates of the NMOS drive transistor N2 and the PMOS load transistor P2. ON/OFF of currents flowing between the sources and drains of the NMOS drive transistor N2 and the PMOS load transistor P2 is controlled based on a signal to be input to the gates of the NMOS drive transistor N2 and the PMOS load transistor P2. An inverted signal is output from the drain of the NMOS drive transistor N2 or the drain of the PMOS load transistor P2. The signal to be output from the drain of the NMOS drive transistor N2 or the drain of the PMOS load transistor P2 is input to the gates of the NMOS drive transistor N1 and the PMOS load transistor P1. As described above, the first memory cell 101 holds a voltage level of a written signal as data (hereinafter, it is referred as memory data) by two CMOS inverters connected in a loop. Then, the memory data reading from the first memory cell 101 and the memory data writing to the first memory cell 101 are performed by controlling ON/OFF of currents flowing between the sources and drains of the NMOS access transistors N3 and N4.

Figure 3:
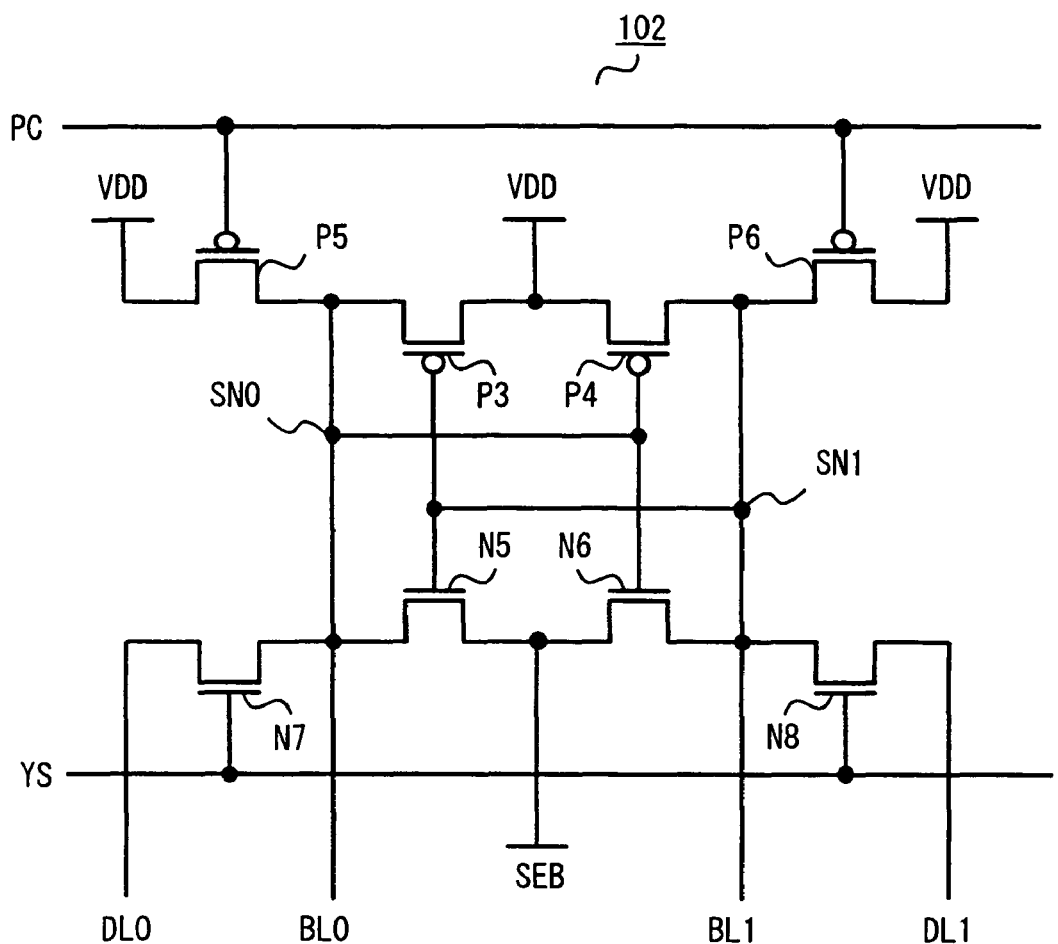
FIG. 3 is a circuit diagram showing a configuration of a second memory cell according to the first exemplary embodiment of the present invention.

FIG. 3 is a circuit diagram showing a configuration of the second memory cell 102. As shown in FIG. 3, the second memory cell 102 includes NMOS drive transistors N5 and N6, NMOS access transistors N7 and N8, PMOS load transistors P3 and P4, and PMOS pre-charge transistors P5 and P6.

The drain of the NMOS drive transistor N5, the gate of the NMOS drive transistor N6, the drain of the PMOS load transistor P3, the gate of the PMOS load transistor P4, the drain of the PMOS pre-charge transistor P5, and the drain of the NMOS access transistor N7 are connected to each other through a second memory node SN0 serving as one of a second memory node pair, or the first bit-line BL0 serving as one of the first bit-line pair BL1/BL0. The gate of the NMOS drive transistor N5, the drain of the NMOS drive transistor N6, the gate of the PMOS load transistor P3, the drain of the PMOS load transistor P4, the drain of the PMOS pre-charge transistor P6, and the drain of the NMOS access transistor N8 are connected to each other through a second memory node SN1 serving as the other of the second memory node pair, or the first bit-line BL1 serving as the other of first bit-line pair BL0/BL1.

The sources of the PMOS load transistors P3 and P4, and the PMOS pre-charge transistors P5 and P6 are connected to the high-voltage-side power supply terminal VDD. The gates of the PMOS pre-charge transistors P5 and P6 are connected to the pre-charge enable signal line PC. The sources of the NMOS drive transistors N5 and N6 are connected to a memory node discharge terminal SEB. The source of the NMOS access transistor N7 is connected to the second bit-line DL0 serving as one of the second bit-line pair DL0/DL1. The gate of the NMOS access transistor N7 is connected to the second word line YS. The source of the NMOS access transistor N8 is connected to the second bit-line DL1 serving as the other of the second bit-line pair DL0/DL1. The gate of the NMOS access transistor N8 is connected to the second word line YS. The circuit configurations of the NMOS drive transistors N5 and N6, the NMOS access transistors N7 and N8, and the PMOS load transistors P3 and P4 of the second memory cell 102 shown in FIG. 3 are similar to those of the first memory cell 101 except for the sources of the NMOS drive transistors N5 and N6 being connected to the memory node discharge terminal SEB.

Here, the second memory node pair (pair of the second memory nodes SN0 and SN1) of the second memory cell 102 arranged in the j-th column in the memory cell array 202 (in which the gates of the NMOS access transistors N7 and N8 are connected to the second word line YS_j) is connected to the M first memory cells 101 arranged in the j-th row in the memory cell array 201 through the first bit-line pair BL0_j/BL1_j.

In the circuit shown in FIG. 3, for example, when the PMOS pre-charge transistors P5 and P6 are ON, the high-voltage-side power supply VDD is supplied to the second memory node pair (pair of the second memory nodes SN0 and SN1) of the second memory cell 102, or the first bit-line pair BL0/BL1. In this case, the second memory cell 102 indicates an indeterminate state in which the memory data is not stored thereto.

For example, the case when the PMOS pre-charge transistors P5 and P6 are OFF, and the memory node discharge terminal SEB is in a floating state by the sense amplifier enable signal SAN will be described. In this case, the source voltages of the NMOS drive transistors N5 and N6 are not fixed at the low-voltage-side power supply GND. Thus, the second memory cell 102 indicates the indeterminate state in which the memory data is not stored thereto.

Further, for example, the case when the PMOS pre-charge transistors P5 and P6 are OFF, and the sense amplifier enable signal SAN is at the low-voltage-side power supply GND will be described. In this case, the second memory cell 102 stores the memory data as well as the first memory cell 101. Then, the reading and writing operations of the memory data are performed by ON/OFF control of the currents flowing between the sources and drains of the NMOS access transistors N7 and N8.

Figure 4:
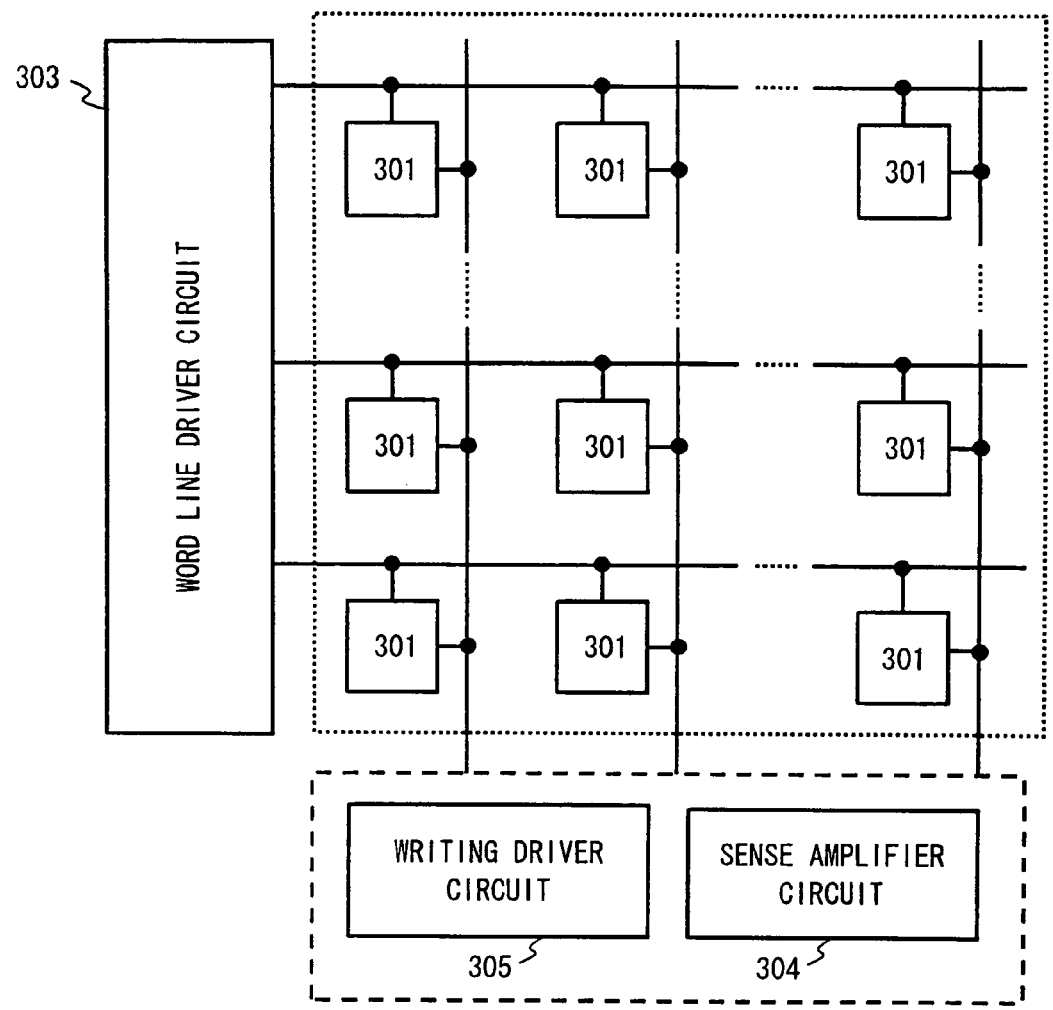
FIG. 4 is a block diagram showing an overall configuration of the semiconductor memory device according to the first exemplary embodiment of the present invention.

FIG. 4 is a block diagram showing an example of an overall configuration of the semiconductor memory device according to the first exemplary embodiment of the present invention. The example of the circuit shown in FIG. 4 includes a plurality of memory cell array parts 301 arranged as a matrix, a word line driver circuit (word line control circuit) 303, a sense amplifier circuit 304, and a writing driver circuit (writing control circuit) 305.

The first word line WL, the second word line YS, the sense amplifier enable signal line SAN, and the pre-charge enable signal line PC connected to the word line driver circuit 303 are wired in the row direction. Then the first word line WL, the corresponding second word line YS, the sense amplifier enable signal line SAN, and the pre-charge enable signal line PC are connected to each of the memory cell array parts 301. The second bit-line pair DL0/DL1 connected to the sense amplifier circuit 304 and the writing driver circuit 305 is wired in the column direction. Then, each of the memory cell array parts 301 is connected to the corresponding second bit-line pair DL0/DL1.

Figure 5:
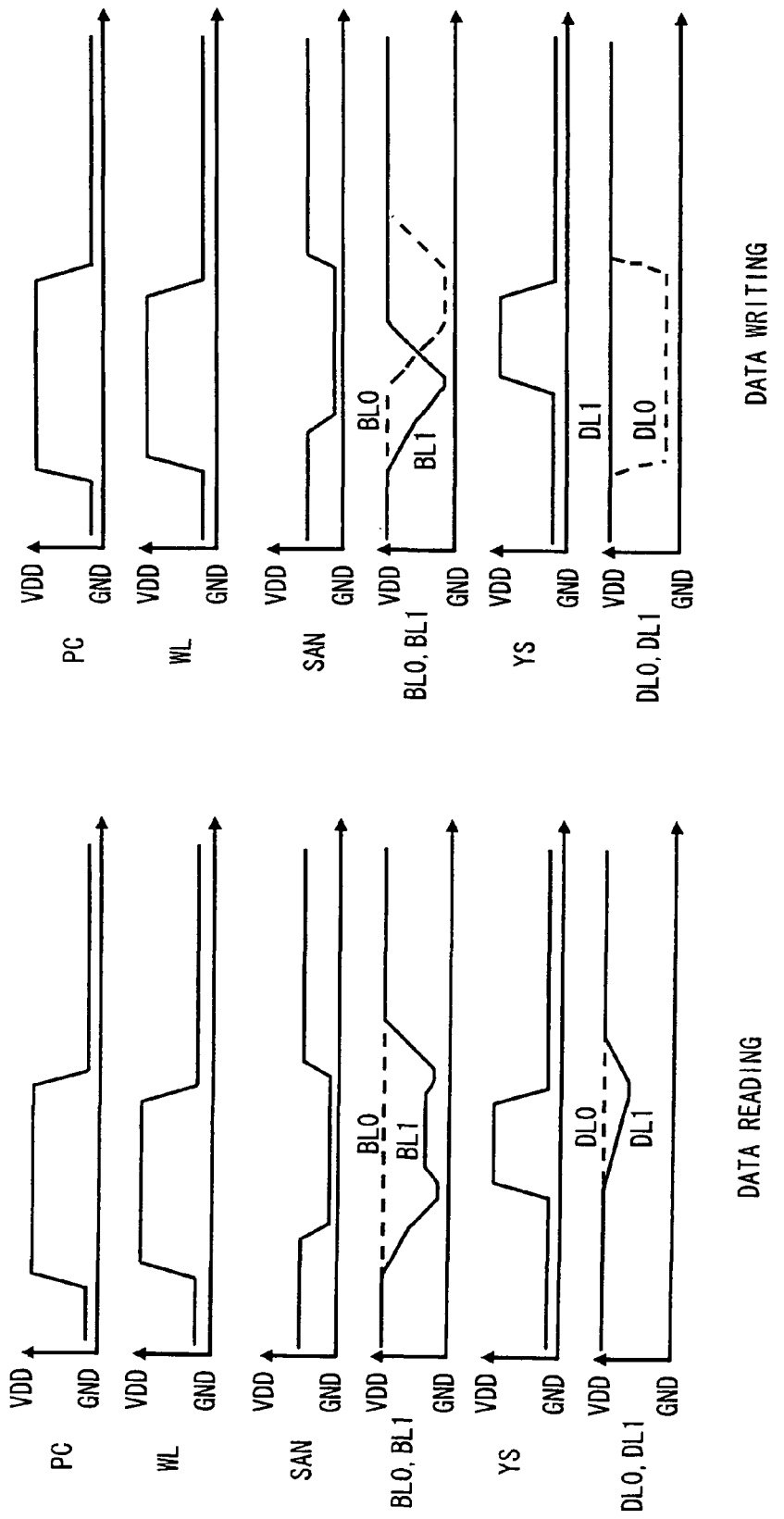
FIG. 5 is a graph showing reading and writing operations of the semiconductor memory device according to the first exemplary embodiment of the present invention.

Next, an operation of the semiconductor memory device according to the first exemplary embodiment of the present invention will be described with reference to FIG. 5. In a standby state, the voltage levels of the first word line WL, all of the second word lines YS, the sense amplifier enable signal SAN, and the pre-charge enable signal PC are at the voltage of the low-voltage-side power supply GND. In this case, the NMOS access transistors N3 and N4 become OFF by the first word line WL. Therefore, the first memory cell 101 holds the memory data already stored. Further, the PMOS pre-charge transistors P5 and P6 become ON by the pre-charge enable signal PC. Therefore, the second memory node pair (pair of the second memory nodes SN0 and SN1) of the second memory cell 102, or the first bit-line pair BL0/BL1, is preliminarily charged to the voltage of the high-voltage-side power supply VDD. In this case, the second memory cell 102 indicates the indeterminate state in which memory data is not stored thereto.

A reading operation of the semiconductor memory device according to the first exemplary embodiment of the present invention will be described. As described above, each of the second bit-line pair DL0/DL1 is preliminarily charged to the voltage of the high-voltage-side power supply VDD before the reading operation is performed. As described above, the memory cell array part 301 includes the first memory cell array 201 in which the M·N first memory cells 101 are arranged as a matrix and the second memory cell array 202 in which the N second memory cells 102 are arranged in the row direction. Hereinafter, the reading operation of the semiconductor memory device according to the present exemplary embodiment will be described in the case of reading the memory data from the first memory cell 101 arranged in the i-th row and j-th column in the first memory cell array 201 of the memory cell array part 301.

First, the pre-charge enable signal PC is transited to the high-voltage-side power supply VDD. Thus, the PMOS pre-charge transistors P5 and P6 become OFF. Next, the first word line WL_i connected to the first memory cell 101 serving as an object of data reading is transited to the high-voltage-side power supply VDD. Therefore, the NMOS access transistors N3 and N4 of the first memory cell 101 become ON. Thus, the memory data held in the first memory cell 101 is output to the first bit-line pair BL0_j/BL1_j.

After a difference of voltages between the first bit-lines BL0_j and BL1_j is generated, the sense amplifier enable signal SAN is transited to the low-voltage-side power supply GND. Thus, the voltage levels of the source terminals of the NMOS drive transistors N5 and N6 are also transited to the low-voltage-side power supply GND. The second memory cell 102 amplifies the difference between the voltages of the first bit-line pair BL0_j/BL1_j (pair of the second memory nodes), and holds an amplified memory data (difference of the voltages of reading data).

Subsequently, the second word line YS_j connected to the second memory cell 102 is transited to the high-voltage-side power supply VDD. Thus, the NMOS access transistors N7 and N8 become ON. Therefore, the amplified memory data (difference of the voltages of the data) held in the second memory cell 102 is output to the second bit-line pair DL0/DL1. The sense amplifier circuit 304 amplifies the difference of the voltages between the second bit-lines DL0 and DL1, and outputs an amplified signal as a reading signal. Here, the second memory cell 102 functions as the local reading circuit controlling the reading operation of the M first memory cells 101 arranged in the j-th column, for example.

Next, a writing operation of the semiconductor memory device according to the first exemplary embodiment of the present invention will be described. As described above, the second bit-line pair DL0/DL1 is preliminarily charged to the voltage of the high-voltage-side power supply VDD before the writing operation is performed. As described above, the memory cell array part 301 includes the first memory cell array 201 in which the M·N first memory cells 101 are arranged as a matrix and the second memory cell array 202 in which the N second memory cells 102 are arranged in the row direction. Hereinafter, the writing operation of the semiconductor memory device according to the present exemplary embodiment will be described in the case of writing the memory data to the first memory cell 101 arranged in the i-th row and j-th column in the first memory cell array 201 of the memory cell array part 301.

First, the pre-charge enable signal PC is transited to the high-voltage-side power supply VDD. Thus, the PMOS pre-charge transistors P5 and P6 become OFF. Next, the first word line WL_i connected to the first memory cell 101 serving as an object of data writing is transited to the high-voltage-side power supply VDD. Therefore, the NMOS access transistors N3 and N4 of the first memory cell 101 become ON. Further, the sense amplifier enable signal SAN is transited to the low-voltage-side power supply GND. Thus, the voltage levels of the source terminals of the NMOS drive transistors N5 and N6 are also transited to the low-voltage-side power supply GND.

On the other hand, the writing driver circuit 305 discharges one of the second bit-line pair DL0/DL1 based on a writing signal from outside. Therefore, a difference of voltages between the second bit-lines DL0 and DL1 larger than that in the reading operation is generated.

Here, the second word line YS_j is transited to the high-voltage-side power supply VDD. Thus, the NMOS access transistors N7 and N8 of the second memory cell 102 become ON. Thus, each of the signals of the second bit-line pair DL0/DL1 is input to the first bit-line pair BL0_j/BL1_j (pair of the second memory nodes). The second memory cell 102 amplifies the difference of voltages of the second memory node pair and holds an amplified memory data (a difference of the voltages of data)

The second memory cell 102 outputs the amplified memory data (the difference of the voltages of the writing data) to the first memory cell 101 serving as an object of data writing through the first bit-line pair BL0_j/BL1_j. Here, the second memory cell 102 functions as the local writing circuit controlling the writing operation of the M first memory cells 101 arranged in the j-th column, for example.

As described above, the circuit according to the exemplary embodiment of the present invention includes a plurality of the first memory cells 101 and a plurality of the second memory cells 102. The second memory cell 102 functions as both of the local reading circuit and writing circuit. Then, the circuit according to the exemplary embodiment of the present invention reads data from the first memory cell 101 that is selected, or writes data to the same. Further, the second memory cell 102 includes smaller number of transistors than conventional ones. Thus, even if the second memory cells 102 are increased and the first memory cells 101 controlled by each of the second memory cells 102 are decreased, an increase in the circuit scale can be suppressed. Furthermore, in the exemplary embodiment of the present invention, the first memory cell array 201 and the second memory cell array 202 are arranged in a regular manner. Besides, a plurality of the first memory cells 101 are arranged as a matrix in the first memory cell array 201. A plurality of the second memory cells 102 are arranged as a matrix in the second memory cell array 202. Therefore, the fall in data reading precision by the device variation is suppressed without a fall in a cell occupation ratio of the first memory cell 101.

Figure 6:
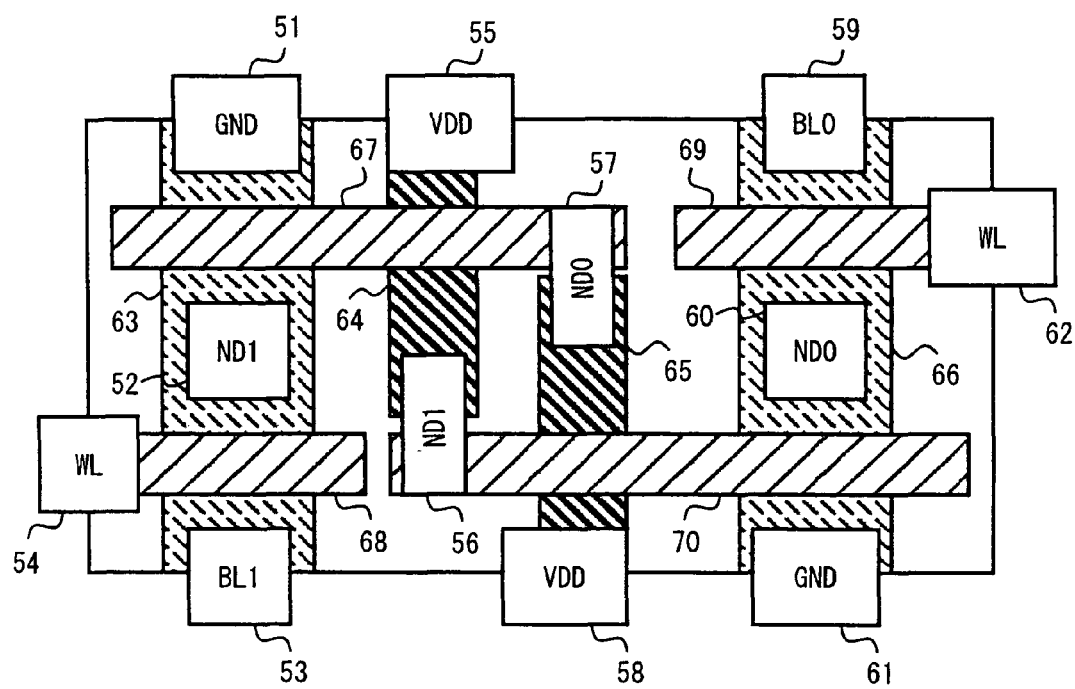
FIG. 6 is a layout diagram showing a layout of the first memory cell according to the first exemplary embodiment of the present invention.

The first memory cell 101 and the first memory cell array 201 including a plurality of the first memory cells 101 will be described. FIG. 6 is a layout diagram showing an example of a layout of the first memory cell 101. As shown in FIG. 6, an N-type diffusion area 66 extending in the longitudinal direction in the right side on the paper plane is formed on a semiconductor substrate. Three contacts 59, 60, and 61 are arranged at regular intervals on the N-type diffusion area 66. The contact 59 is connected to the first bit-line BL0. The contact 60 is connected to the first memory node ND0. The contact 61 is connected to the low-voltage-side power supply terminal GND. A gate poly-silicon 69 extending in the traverse direction is formed on the N-type diffusion area 66 between the contacts 59 and 60. The gate poly-silicon 69 is connected to the first word line WL through a contact 62. In sum, the contact 59 is the source terminal of the NMOS access transistor N3. The contact 62 is the gate terminal of the NMOS access transistor N3. The contact 60 is the drain terminal of the NMOS access transistor N3. A gate poly-silicon 70 extending in the traverse direction is formed on the N-type diffusion area 66 between the contacts 60 and 61. The gate poly-silicon 70 is connected to the memory node ND1 through a contact 56. In sum, the contact 61 is the source terminal of the NMOS drive transistor N1. The contact 56 is the gate terminal of the NMOS drive transistor N1. The contact 60 is the drain terminal of the NMOS drive transistor N1.

As shown in FIG. 6, P-type diffusion areas 64 and 65 extending in the longitudinal direction in the center on the paper plane are further formed on the semiconductor substrate. Contacts 55 and 56 are arranged on the P-type diffusion area 64. The contact 55 is connected to the high-voltage-side power supply terminal VDD. The contact 56 is connected to the memory node ND1 as well as the gate poly-silicon 70 as described above. A gate poly-silicon 67 extending in the traverse direction is formed on the P-type diffusion area 64 between the contacts 55 and 56. The gate poly-silicon 67 is connected to the memory node ND0 through a contact 57. In sum, the contact 55 is the source terminal of the PMOS load transistor P2. The contact 57 is the gate terminal of the PMOS load transistor P2. The contact 56 is the drain terminal of the PMOS load transistor P2. Contacts 57 and 58 are arranged on the P-type diffusion area 65. The contact 57 is connected to the memory node ND0 as well as the poly-silicon 67 as described above. The contact 58 is connected to the high-voltage-side power supply terminal VDD. The gate poly-silicon 70 described above is formed on the P-type diffusion area 65 between the contacts 57 and 58. In sum, the contact 58 is the source terminal of the PMOS load transistor P1. The contact 56 is the gate terminal of the PMOS load transistor P1. The contact 57 is the drain terminal of the PMOS load transistor P1.

Figure 7:
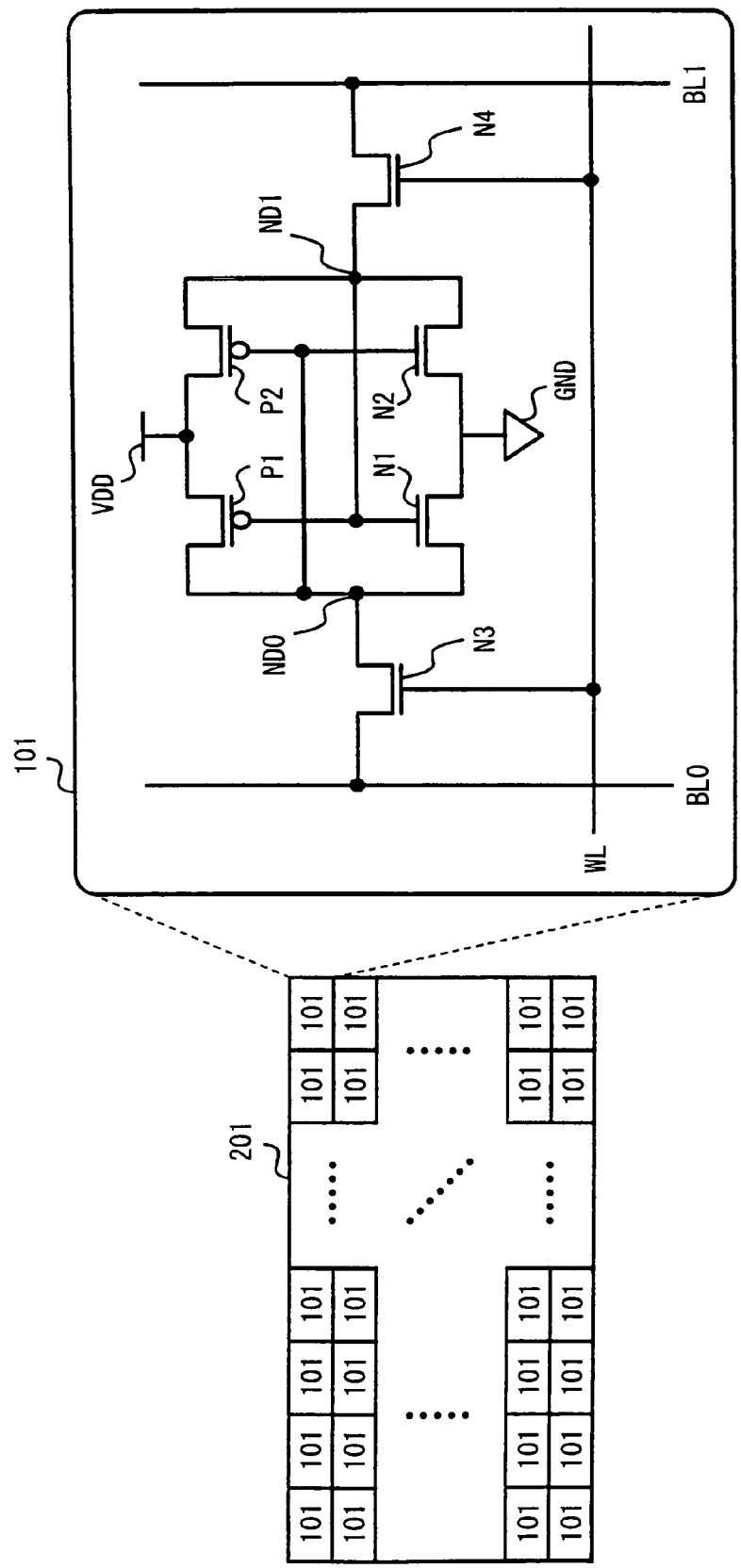
FIG. 7 is a layout diagram showing a layout of the first memory cell according to the first exemplary embodiment of the present invention.

As shown in FIG. 6, an N-type diffusion area 63 extending in the longitudinal direction in the left side on the paper plane is further formed on the semiconductor substrate. Three contacts 51, 52, and 53 are arranged at regular intervals on the N-type diffusion area 63. The contact 51 is connected to the low-voltage-side power supply terminal GND. The contact 52 is connected to the first memory node ND1. The contact 53 is connected to the first bit-line BL1. The gate poly-silicon 67 described above is formed on the N-type diffusion area 63 between the contacts 51 and 52. In sum, the contact 51 is the source terminal of the NMOS drive transistor N2. The contact 57 is the gate terminal of the NMOS drive transistor N2. The contact 52 is the drain terminal of the NMOS drive transistor N2. A gate poly-silicon 68 extending in the traverse direction is formed on the N-type diffusion area 63 between the contacts 52 and 53. The gate poly-silicon 68 is connected to the first word line WL through a contact 54. In sum, the contact 53 is the source terminal of the NMOS access transistor N4. The contact 54 is the gate terminal of the NMOS access transistor N4. The contact 52 is the drain terminal of the NMOS access transistor N4. A plurality of the first memory cells 101 having the layout described above are arranged as a matrix, as shown in FIG. 7 for example, thereby constituting the first memory cell array 201.

Figure 8:
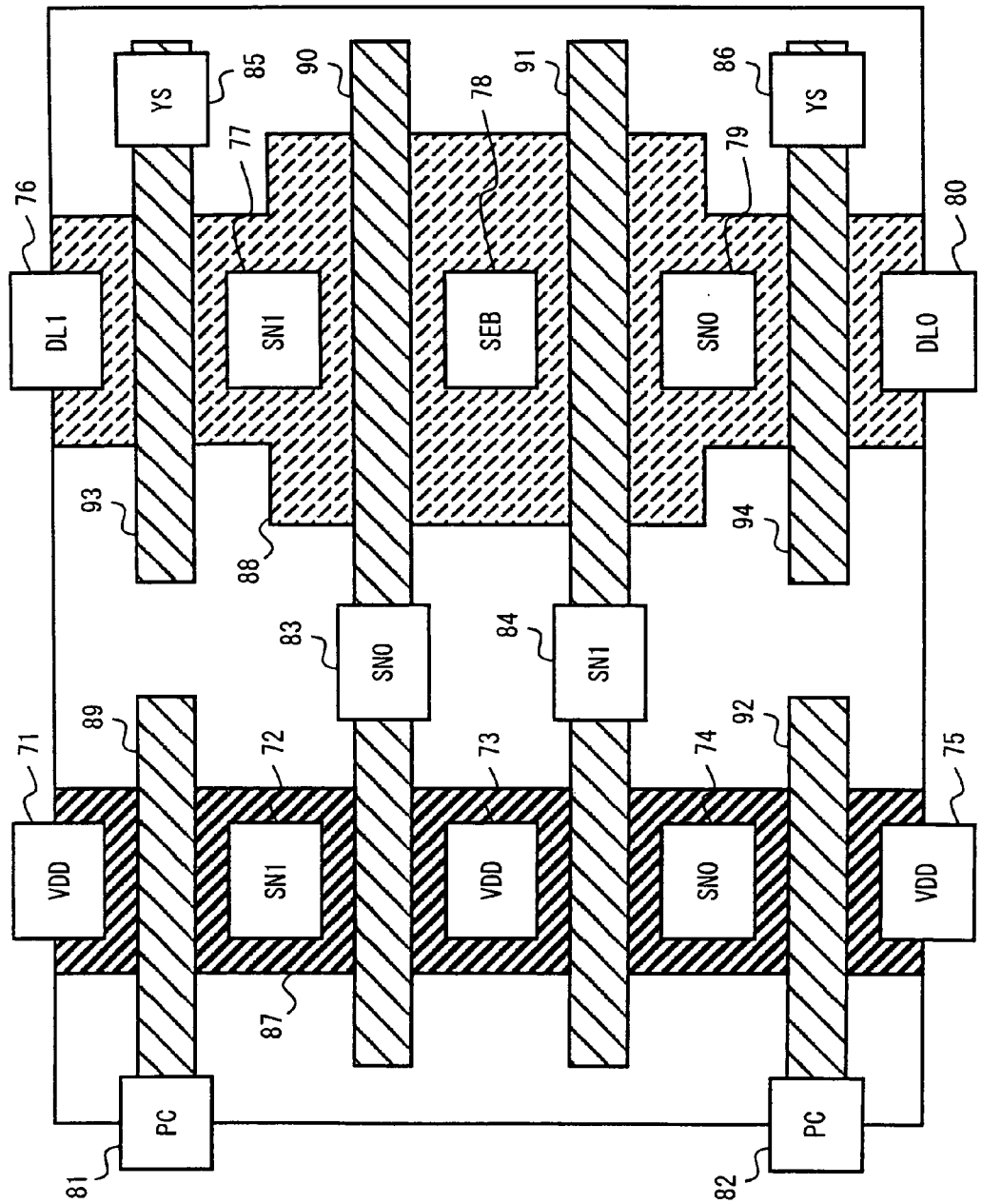
FIG. 8 is a layout diagram showing a layout of the second memory cell according to the first exemplary embodiment of the present invention.

Next, the second memory cell 102 and the memory cell array 202 including a plurality of the second memory cells 102 will be described. FIG. 8 is a layout diagram showing an example of a layout of the second memory cell 102. As shown in FIG. 8, an N-type diffusion area 88 extending in the longitudinal direction in the right side on the paper plane is formed on the semiconductor substrate. Five contacts 76 to 80 are arranged at regular intervals on the N-type diffusion area 88. The contact 76 is connected to the second bit-line DL1. The contact 77 is connected to the second memory node SN1. The contact 78 is connected to the memory node discharge terminal SEB. The contact 79 is connected to the second memory node SN0. The contact 80 is connected to the second bit-line DL0. A rectangle gate poly-silicon 93 extending in the traverse direction is formed on the N-type diffusion area 88 between the contacts 76 and 77. The gate poly-silicon 93 is connected to the second word line YS through a contact 85. In sum, the contact 76 is the source terminal of the NMOS access transistor N8. The contact 85 is the gate terminal of the NMOS access transistor N8. The contact 77 is the drain terminal of the NMOS access transistor N8. A rectangle gate poly-silicon 90 extending in the traverse direction is formed on the N-type diffusion area 88 between the contacts 77 and 78. The gate poly-silicon 90 is connected to the second memory node SN0 through a contact 83. In sum, the contact 78 is the source terminal of the NMOS drive transistor N6. The contact 83 is the gate terminal of the NMOS drive transistor N6. The contact 77 is the drain terminal of the NMOS drive transistor N6.

A rectangle gate poly-silicon 91 extending in the traverse direction is formed on the N-type diffusion area 88 between the contacts 78 and 79. The gate poly-silicon 91 is connected to the second memory node SN1 through a contact 84. In sum, the contact 78 is the source terminal of the NMOS drive transistor N5. The contact 84 is the gate terminal of the NMOS drive transistor N5. The contact 79 is the drain terminal of the NMOS drive transistor N5. A rectangle gate poly-silicon 94 extending in the traverse direction is formed on the N-type diffusion area 88 between the contacts 79 and 80. The gate poly-silicon 94 is connected to the second word line YS through a contact 86. In sum, the contact 80 is the source terminal of the NMOS access transistor N7. The contact 86 is the gate terminal of the NMOS access transistor N7. The contact 79 is the drain terminal of the NMOS access transistor N7. As shown in FIG. 8, a P-type diffusion area 87 extending in the longitudinal direction in the left side on the paper plane is formed on the semiconductor substrate. Five contacts 71 to 75 are arranged at regular intervals on the P-type diffusion area 87. The contacts 71, 73 and 75 are connected to the high-voltage-side power supply terminal VDD. The contact 72 is connected to the second memory node SN1. The contact 74 is connected to the second memory node SN0. A rectangle gate poly-silicon 89 extending in the traverse direction is formed on the P-type diffusion area 87 between the contacts 71 and 72. The gate poly-silicon 89 is connected to the pre-charge enable signal PC through a contact 81. In sum, the contact 71 is the source terminal of the PMOS pre-charge transistor P6. The contact 81 is the gate terminal of the PMOS pre-charge transistor P6. The contact 72 is the drain terminal of the PMOS pre-charge transistor P6.

Figure 9:
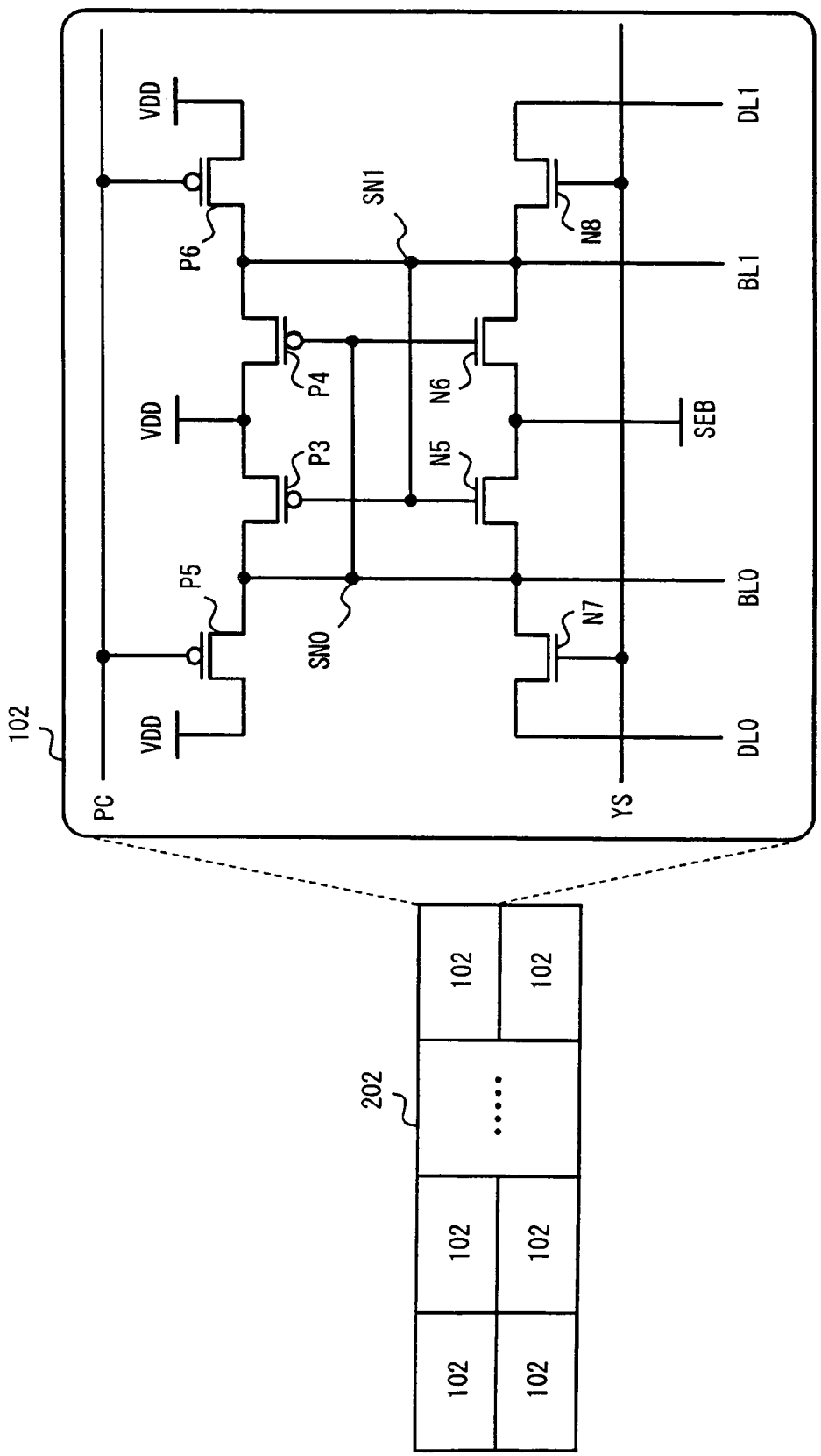
FIG. 9 is a layout diagram showing a layout of the second memory cell according to the first exemplary embodiment of the present invention.

The gate poly-silicon 90 described above is formed on the P-type diffusion area 87 between the contacts 72 and 73. In sum, the contact 73 is the source terminal of the PMOS load transistor P4. The contact 83 is the gate terminal of the PMOS load transistor P4. The contact 72 is the drain terminal of the PMOS load transistor P4. The gate poly-silicon 91 described above is formed on the P-type diffusion area 87 between the contacts 73 and 74. In sum, the contact 73 is the source terminal of the PMOS load transistor P3. The contact 84 is the gate terminal of the PMOS load transistor P3. The contact 74 is the drain terminal of the PMOS load transistor P3. A rectangle gate poly-silicon 92 extending in the traverse direction is formed on the P-type diffusion area 87 between the contacts 74 and 75. The gate poly-silicon 92 is connected to the pre-charge enable signal PC through a contact 82. In sum, the contact 75 is the source terminal of the PMOS pre-charge transistor P5. The contact 82 is the gate terminal of the PMOS pre-charge transistor P5. The contact 74 is the drain terminal of the PMOS pre-charge transistor P5. A plurality of the second memory cells 102 having the layout described above are arranged as a matrix, as shown in FIG. 9 for example, thereby constituting the second memory cell array 202.

Note that the circuit shown in FIG. 6 adopts the SRAM circuit including eight transistors as described above. Thus, the area of the circuit is smaller than ever before. Further, in the circuit shown in FIG. 6, cells are generated by applying not a logic design-rule but a memory design-rule. Thus, the area of the circuit becomes further smaller. Here, the second memory cell 102 has a larger area (cell size) than the first memory cell 101. The area (cell size) of the second memory cell 102 preferably is twice or more as large as that of the first memory cell 101. For example, the area of the circuit shown in FIG. 8 is about four times as large as the circuit shown in FIG. 6. In sum, the second memory cell 102 has the area capable of suppressing a device variation. Therefore, in the present exemplary embodiment, the fall in the data reading precision by the device variation can be suppressed. Further, the first memory cell array 201 has an area twice or more larger in comparison with the second memory cell array 202. Therefore, in the present exemplary embodiment, it is possible to improve the cell occupation ratio of the first memory cell 101.

The layout configuration of the semiconductor memory device according to the present exemplary embodiment will be further described in detail. Note that the second memory cell 102 has an area four times as large as that of the first memory cell 101 in the present exemplary embodiment.

Figure 10:
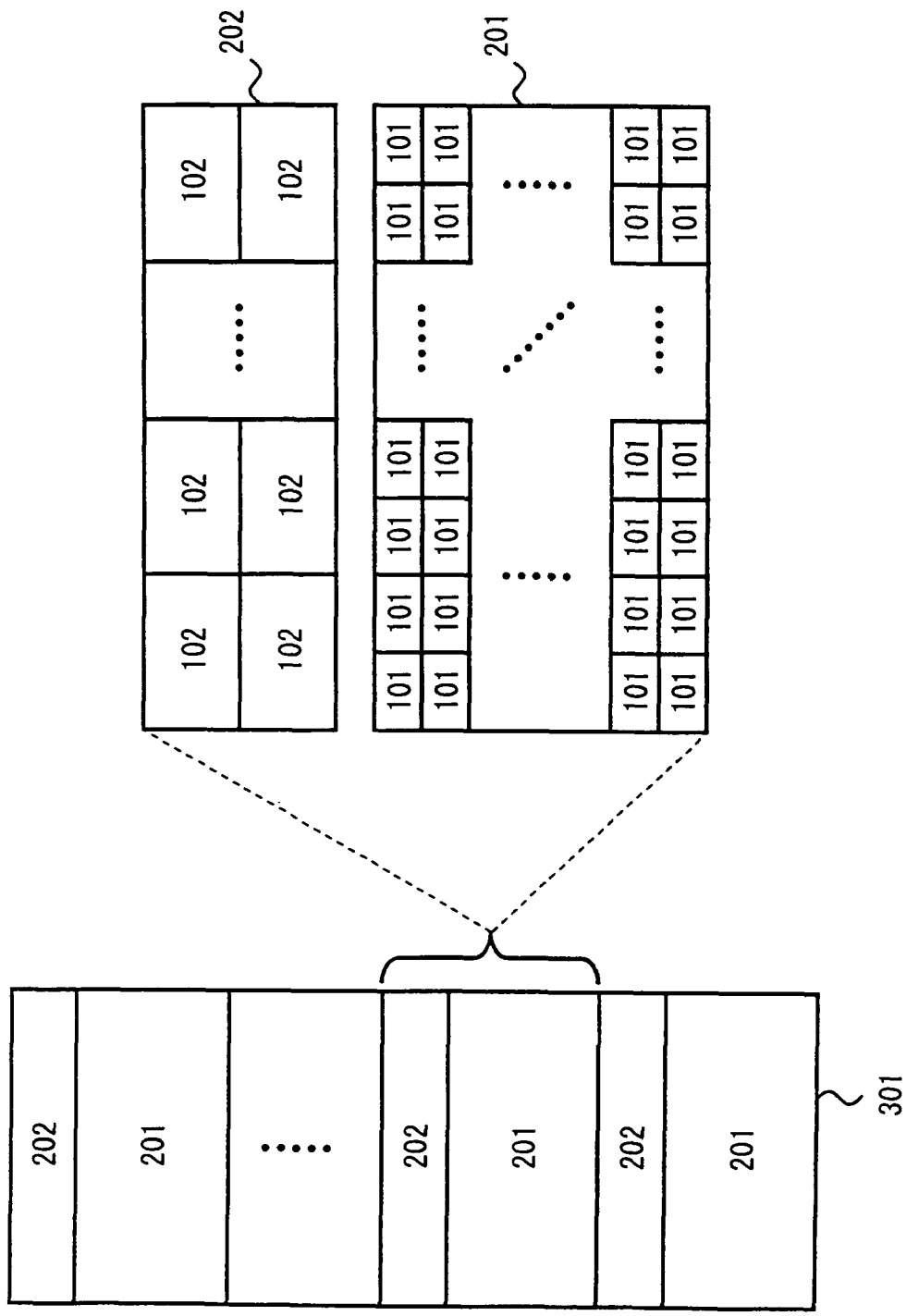
FIG. 10 is a layout diagram showing a layout of a memory cell array part according to the first exemplary embodiment of the present invention.

FIG. 10 is a layout diagram showing a layout of the memory cell array part 301. The memory cell array part 301 includes a plurality of the first memory cell arrays 201 and a plurality of the second memory cell arrays 202 corresponding thereto. A first memory cell array 201 and a second memory cell array 202 corresponding thereto constitute a memory cell array part. In the present exemplary embodiment, an example when lengths in the row direction of the first memory cell array 201 and the second memory cell array 202 are about the same will be described.

In the memory cell array part (expanded diagram in FIG. 10) constituting the memory cell array part 301, the second memory cell array 202 is arranged in the upper side of the paper plane. The first memory cell array 201 is arranged in the lower side of the paper plane. The first memory cell array 201 and the second memory cell array 202 are arranged opposite to each other in the column direction. As described above, a plurality of the first memory cells 101 are arranged as a matrix in the first memory cell array 201. A plurality of the second memory cells 102 are arranged as a matrix in the second memory cell array 202. Here, each of the second memory cells 102 amplifies and stores a difference of voltages of data that is written to or read from the one of a plurality of the first memory cells 101 arranged in the corresponding column.

Further, the area of the first memory cell array 201 is twice or more as large as that of the second memory cell array 202 by increasing the number of the first memory cells 101 arranged in the first memory cell array 201. In sum, the area of the first memory cell array 201 is twice or more as large as that of the second memory cell array 202 by increasing the number of the first memory cells 101 controlled by each of the second memory cells 102. This makes it possible to improve the cell occupation ratio of the first memory cell 101. When an area of the first memory cell array 201 is less than twice as large as that of the second memory cell array 202, the cell occupation ratio of the first memory cell 101 falls. As a result, the circuit scale increases. In the circuit shown in FIG. 10, the memory cell array part 301 is constituted by placing a plurality of the memory cell array parts having the layout configuration described above in the column direction.

Figure 11:
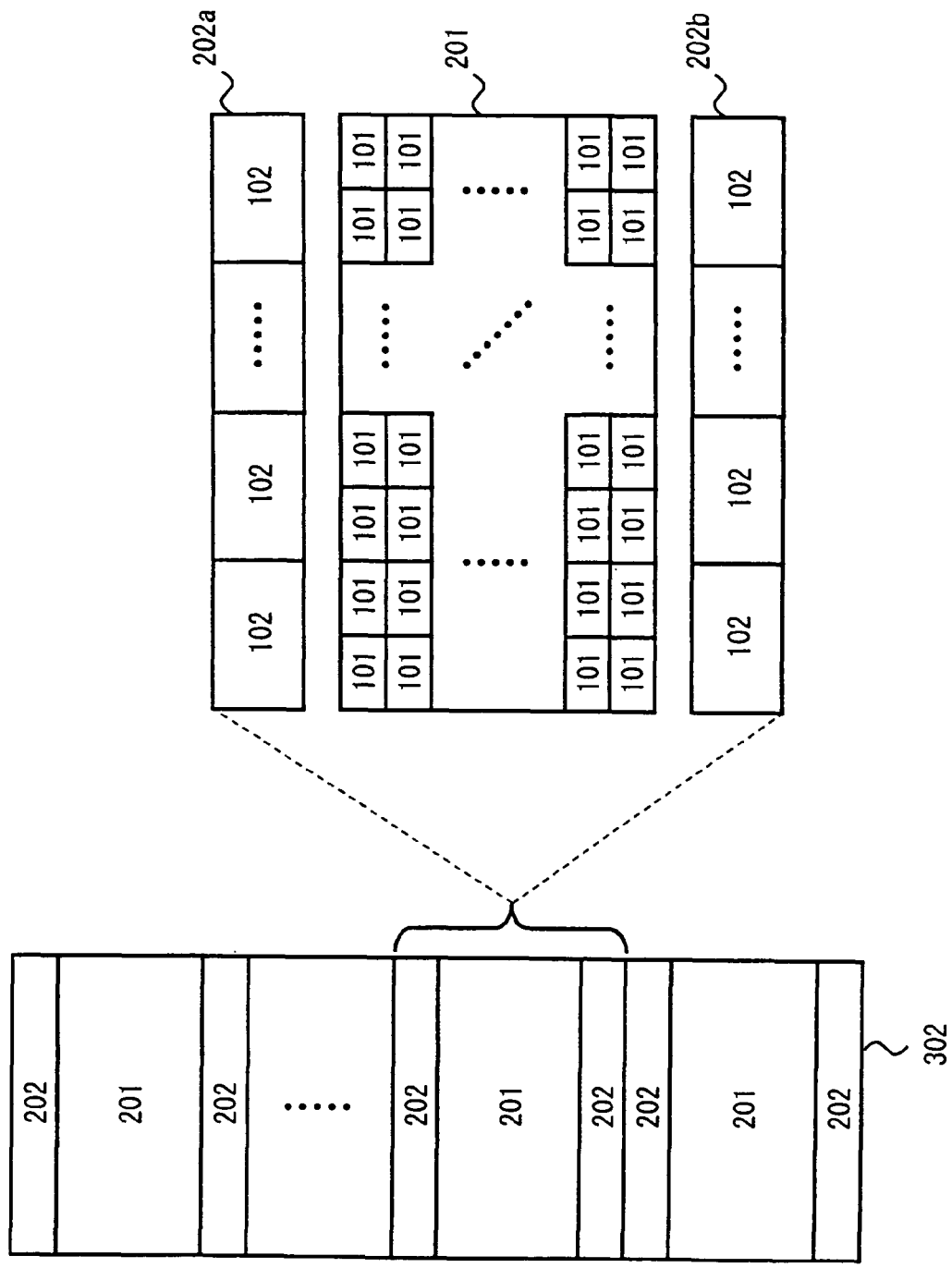
FIG. 11 is a layout diagram showing a layout of a memory cell array part according to the first exemplary embodiment of the present invention.

FIG. 11 is a layout diagram showing a layout of a memory cell array part 302. The memory cell array part 302 includes a plurality of the first memory cell arrays 201 and a plurality of the second memory cell arrays 202 corresponding thereto. In FIG. 11, unlike FIG. 10, the second memory cells 202 are separately arranged in two parts in each of the memory cell array parts. Then, the first memory cell array 201 is arranged between the separated two parts of the second memory cell array 202. Hereinafter, one of the second memory cell arrays 202 is referred as a second memory cell array 202a, and the other of the second memory cell arrays 202 is referred as a second memory cell array 202b.

In the memory cell array part (expanded diagram in FIG. 11) constituting the memory cell array part 302, the second memory cell array 202a is arranged in the upper side of the paper plane. The second memory cell array 202b is arranged in the lower side of the paper plane. The first memory cell array 201 is arranged in the center of the paper plane. The lower side of the second memory cell array 202a and the upper side of the first memory cell array 201 are arranged face to face in the column direction. The lower side of the first memory cell array 201 and the upper side of the second memory cell array 202b are arranged face to face in the column direction. Here, each of the second memory cells 102 amplifies and stores a difference of voltages of data that is written to or read from the one of a plurality of the first memory cells 101 arranged in the corresponding column. According to the layout configuration described above, an effect similar to the case in FIG. 10 can be obtained.

Figure 12:
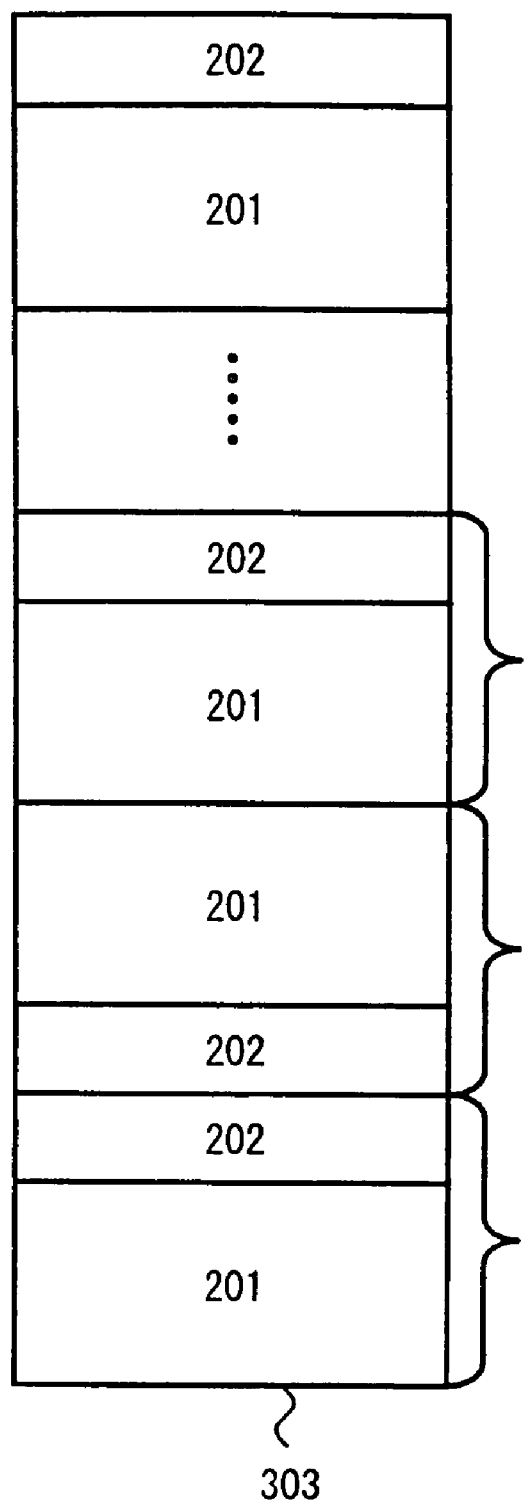
FIG. 12 is a layout diagram showing a layout of a memory cell array part according to the first exemplary embodiment of the present invention.

FIG. 12 is a layout diagram showing a layout of a memory cell array part 303. The memory cell array part 303 includes a plurality of the first memory cell arrays 201 and a plurality of the second memory cell arrays 202 corresponding thereto. Memory cell array parts constituting the memory cell array part 303 are arranged in the column direction by mirror-inverting each pair of the first cell array 201 and second cell array 202 in FIG. 12, unlike FIG. 10. In other words, the adjacent memory cell array parts are arranged with mirror inversion in the column direction. According to the layout configuration described above, it is possible to decrease the number of separate areas between the first memory cell arrays 201 and the second memory cell arrays 202. Therefore, this makes it possible to further improve the cell occupation ratio of the first memory cell 101.

As described above, the semiconductor memory device according to the present invention has the area capable of suppressing the device variation by the second memory cell 102. Then, the area of the first memory cell array 201 is twice or more as large as that of the second memory cell array 202. Therefore, the semiconductor memory device according to the present invention can suppress the reduction of the data reading precision due to the device variation without a fall in cell occupation ratio of the first memory cell 101.

Second Exemplary Embodiment

In the first exemplary embodiment, the example when the word line driver circuit 303 directly outputs the sense amplifier enable signal SAN is described. On the other hand, an example when an amplification control circuit 103 (control cell) generating the sense amplifier enable signal SAN is further included will be described in a second exemplary embodiment. The word line driver circuit 303 outputs a control signal (a fifth control signal) SE in place of the sense amplifier enable signal SAN. The amplification control circuit 103 controls an output of the sense amplifier enable signal SAN based on the control signal SE from the word line driver circuit 303. The other circuit configurations are similar to those in the first exemplary embodiment, and thus description will be omitted.

Figure 13:
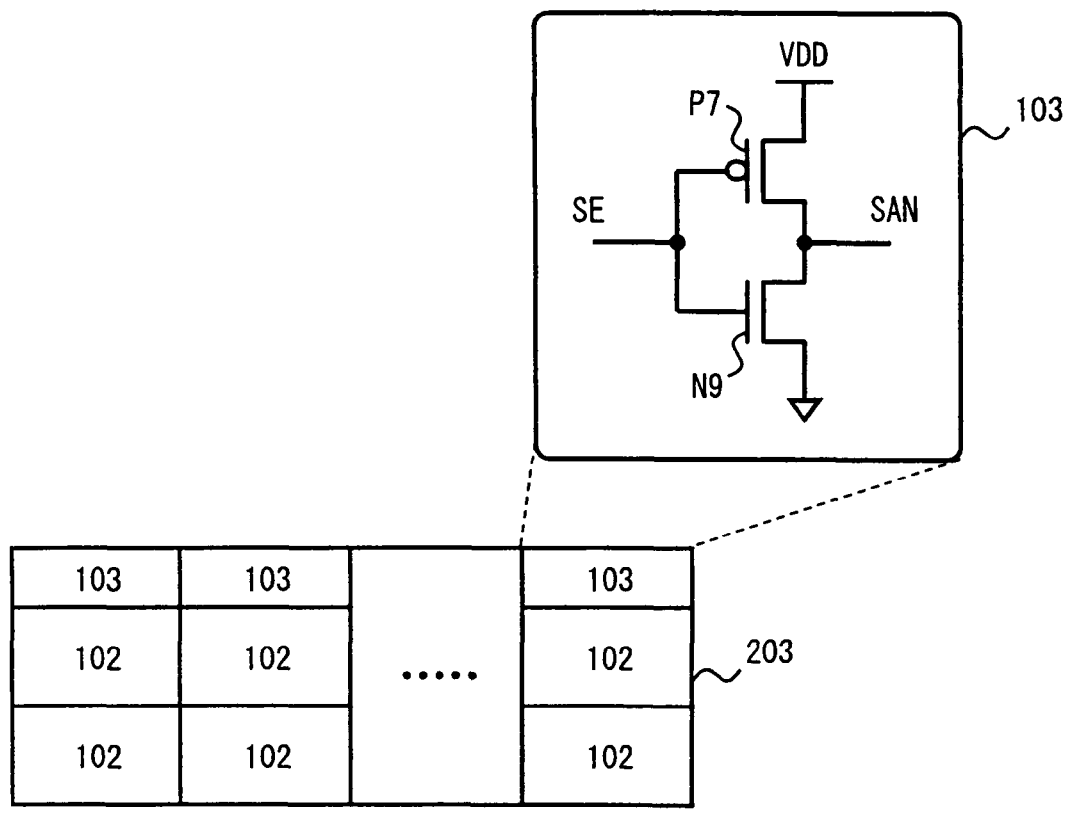
FIG. 13 is a layout diagram showing a layout of a third memory cell array part according to a second exemplary embodiment of the present invention.

FIG. 13 is a layout diagram showing a layout of the amplification control circuit 103 and a third memory cell array 203 including the same. The amplification control circuit 103 is an inverter including a PMOS transistor P7 and an NMOS transistor N9, for example. The inverter receives the control signal SE from the word line driver circuit 303, and outputs the sense amplifier enable signal SAN to the memory node discharge terminal SEB of the second memory cells 102 corresponding thereto. A plurality of cells for the amplification control circuit 103 having the circuit configuration described above are arranged in the row direction and a plurality of the second memory cells 102 are arranged as a matrix, thereby constituting the third memory cell array 203.

In the example in FIG. 13, the memory cell array including the amplification control circuits 103 and the memory cell array including the second memory cells 102 are arranged face to face in the column direction. Here, each of the amplification control circuits 103 outputs the sense amplifier enable signal SAN having a high drive-ability to the memory node discharge terminal SEB of the second memory cells 102 corresponding thereto.

Ordinarily, there is a limit in the number of the second memory cells 102 commonly connected to one sense amplifier enable signal SAN in order to prevent a great current from flowing into the sense amplifier enable signal SAN. For example, as shown in FIG. 1, when the word line driver circuit 303 directly outputs the sense amplifier enable signal SAN, the number of the second memory cells 102 arranged in the row direction is limited. On the other hand, in the second exemplary embodiment, the sense amplifier enable signal SAN having the high drive-ability is supplied to each of the second memory cells 102. Therefore, the number of the second memory cells 102 which one of the word line driver circuits 303 can control is not limited. As a result, it is possible to improve the cell occupation ratio of the first memory cell 101.

Figure 14:
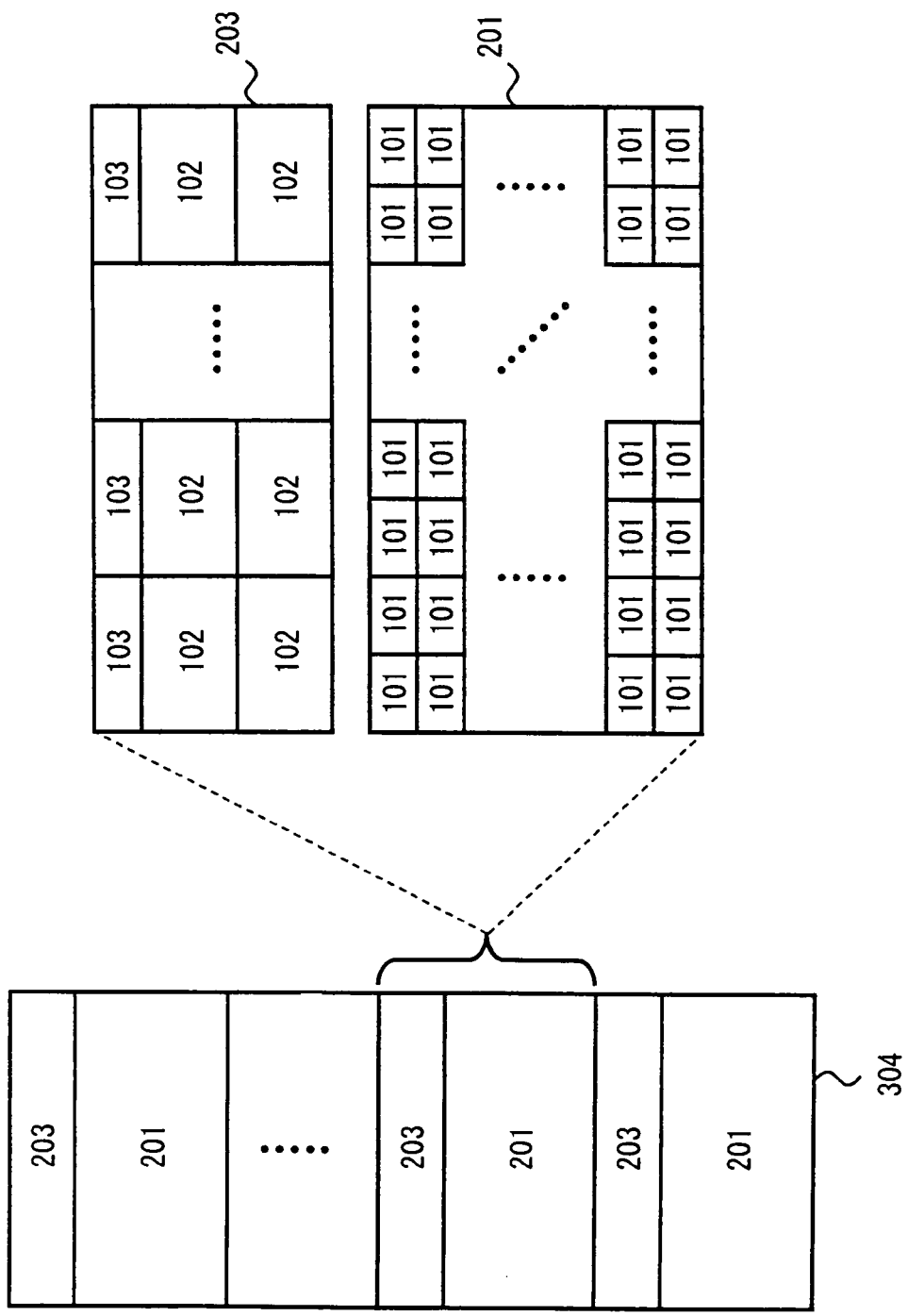
FIG. 14 is a layout diagram showing a layout of a memory cell array part according to the second exemplary embodiment of the present invention.

FIG. 14 is a layout diagram showing a layout of a memory cell array part 304. The memory cell array part 304 includes a plurality of the first memory cell arrays 201 and a plurality of the third memory cell arrays 203 corresponding thereto. One of the first memory cell arrays 201 and one of the third memory cell arrays 203 corresponding thereto constitute a memory cell array part. In the present exemplary embodiment, an example when lengths in the row direction of the first memory cell array 201 and the third memory cell array 203 are about the same will be described.

In the memory cell array part (expanded diagram in FIG. 14) constituting the memory cell array part 304, the third memory cell array 203 is arranged in the upper side of the paper plane. The first memory cell array 201 is arranged in the lower side of the paper plane. The first memory cell array 201 and the third memory cell array 203 are arranged face to face in the column direction. As described above, a plurality of the first memory cells 101 are arranged as a matrix in the first memory cell array 201. A plurality of the amplification control circuits 103 are arranged in the row direction in the third memory cell array 203. Further, a plurality of the second memory cells 102 are arranged as a matrix in the third memory cell array 203. Here, each of the second memory cells 102 amplifies and stores a difference of voltages of data that is written to or read from the one of a plurality of the first memory cells 101 arranged in the corresponding column.

Further, the area of the first memory cell array 201 is twice or more as large as that of the third memory cell array 203 by increasing the number of the first memory cells 101 arranged in the first memory cell array 201. In sum, the area of the first memory cell array 201 is twice or more as large as that of the third memory cell array 203 by increasing the number of the first memory cells 101 controlled by each of the second memory cells 102. This makes it possible to improve the cell occupation ratio of the first memory cell 101. When an area of the first memory cell array 201 is less than twice as large as that of the third memory cell array 203, the cell occupation ratio of the first memory cell 101 falls. As a result, the circuit scale increases. In the circuit shown in FIG. 14, the memory cell array part 304 is constituted by placing a plurality of the memory cell array parts having the layout configuration described above in the column direction.

Figure 15:
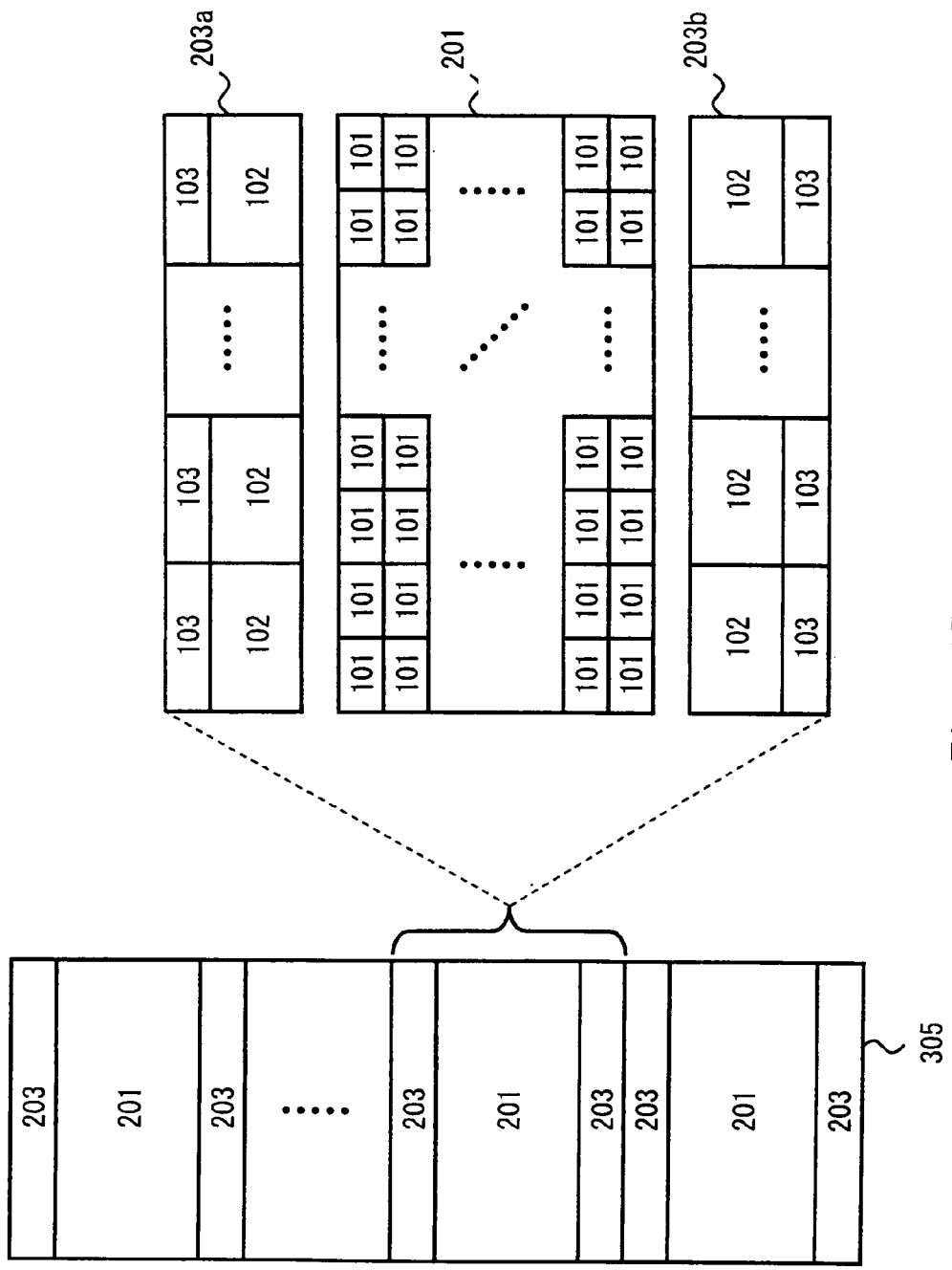
FIG. 15 is a layout diagram showing a layout of a memory cell array part according to the second exemplary embodiment of the present invention.

FIG. 15 is a layout diagram showing a layout of a memory cell array part 305. The memory cell array part 305 includes a plurality of the first memory cell arrays 201 and a plurality of the third memory cell arrays 203 corresponding thereto. The third memory cell arrays 203 are separately arranged in two parts in the each of the memory cell array parts in FIG. 15, unlike FIG. 14. Then, the first memory cell array 201 is arranged between the separated two parts of the third memory cell arrays 203. Hereinafter, one of the third memory cell arrays 203 is referred as a third memory cell array 203a, and the other of the third memory cell arrays 203 is referred as a third memory cell array 203b.

In the memory cell array part (expanded diagram in FIG. 15) constituting the memory cell array part 305, the third memory cell array 203a is arranged in the upper side of the paper plane. The third memory cell array 203b is arranged in the lower side of the paper plane. The first memory cell array 201 is arranged in the center of the paper plane. The lower side of the third memory cell array 203a and the upper side of the first memory cell array 201 are arranged face to face in the column direction. The lower side of the first memory cell array 201 and the upper side of the third memory cell array 203b are arranged face to face in the column direction. Here, each of the second memory cells 102 amplifies and stores a difference of voltages of data that is written to or read from the one of a plurality of the first memory cells 101 arranged in the corresponding column. According to the layout configuration described above, an effect similar to the case of FIG. 14 can be obtained.

Figure 16:
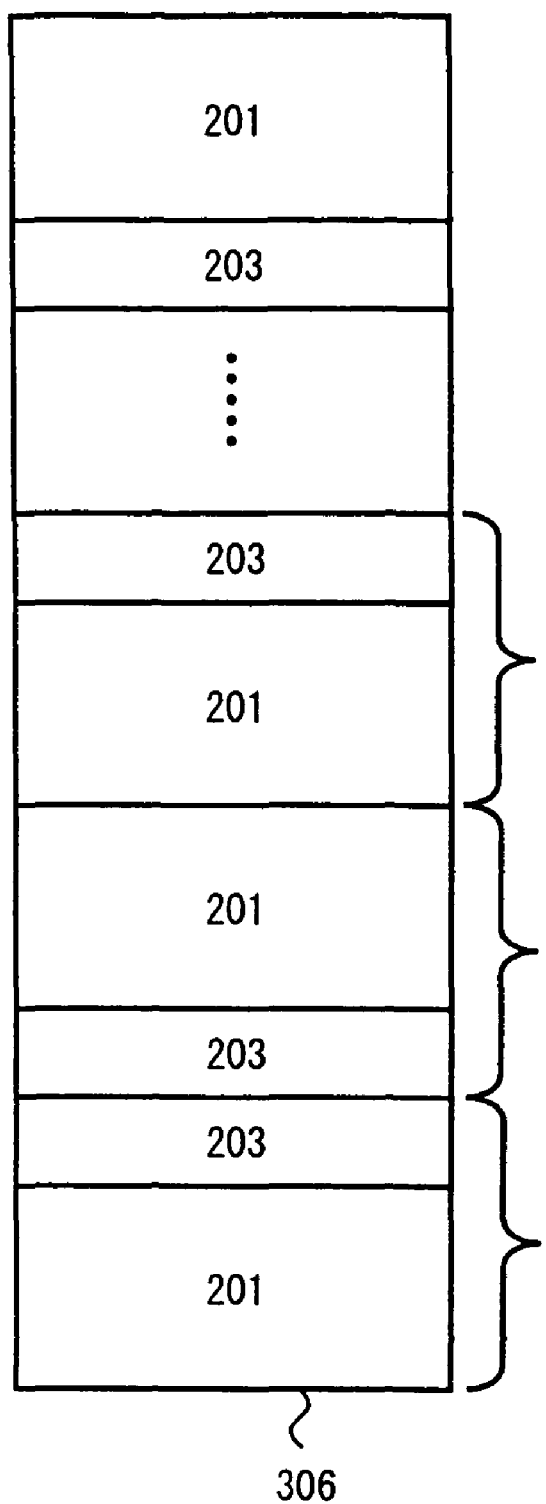
FIG. 16 is a layout diagram showing a layout of a memory cell array part according to the second exemplary embodiment of the present invention.

FIG. 16 is a layout diagram showing a layout of a memory cell array part 306. The memory cell array part 306 includes a plurality of the first memory cell arrays 201 and a plurality of the third memory cell arrays 203 corresponding thereto. Memory cell array parts constituting the memory cell array part 306 are arranged in the column direction by mirror-inverting each pair of the first memory cell array 201 and the third memory cell array 203 in FIG. 16, unlike FIG. 14. In other words, the adjacent memory cell array parts are arranged with mirror inversion in the column direction in FIG. 16. According to the layout configuration described above, it is possible to decrease the number of separate areas between the first memory cell arrays 201 and the third memory cell arrays 203. Therefore, this makes it possible to further improve the cell occupation ratio of the first memory cell 101.

As described above, the semiconductor memory device according to the present exemplary embodiment has the area capable of suppressing the device variation by the second memory cell 102. Then, the area of the first memory cell array 201 is twice or more as large as that of the third memory cell array 203. Therefore, the semiconductor memory device according to the present exemplary embodiment can suppress the fall in the data reading precision due to the device variation without a fall in the cell occupation ratio of the first memory cell 101.

Note that the present invention is not limited to the above-described exemplary embodiments but can be changed as appropriate without departing from the spirit of the present invention. For example, in the exemplary embodiments described above, the lengths in the row direction of the first memory cell array 201 and the second memory cell array 202 (or the third memory cell array 203) are about the same. However, it is not limited to this example. For example, a layout in which the length in the row direction of the first memory cell array 201 is longer than that of the second memory cell array 202 (or the third memory cell array 203) may be applied. Further, it is possible to arrange other cells such as dummy cells or the like in a space generated thereby.

Further, in the exemplary embodiments described above, the circuit in which the first memory cell 101 is the SRAM is applied. However, it is not limited to this example. For example, a circuit in which the first memory cell 101 is a DRAM (Dynamic Random Access Memory) may be applied.

Furthermore, in the exemplary embodiments described above, the amplification control circuit 103 is the inverter including the PMOS transistor P7 and the NMOS transistor N9. However, it is not limited to this example. For example, a circuit configuration may be applied in which the amplification control circuit 103 only includes the NMOS transistor N9 and ON/OFF of the low-voltage-side power supply GND and memory node discharge terminal SEB is changed based on the control signal SE.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor memory device comprising:
   a first memory cell array in which a plurality of first memory cells are arranged as a matrix, data being read from or written to the first memory cells; and
   a second memory cell array in which a plurality of second memory cells amplifying and storing the data of one of the plurality of the first memory cells arranged in a corresponding column are arranged as a matrix, wherein
   the first memory cell array and the second memory cell array are arranged face to face in the column direction;
   an area of the second memory cell is larger than that of the first memory cell; and
   an area of the first memory cell array is twice or more as large as that of the second memory cell array.

2. The semiconductor memory device according to claim 1, wherein the second memory cell comprises an NMOS access transistor, a PMOS load transistor, an NMOS drive transistor having a source terminal that is externally controlled, and a PMOS pre-charge transistor.

3. The semiconductor memory device according to claim 1, wherein an area of the second memory cell is twice or more as large as that of the first memory cell.

4. The semiconductor memory device according to claim 1, wherein a length of the first memory cell array in the row direction is equal to or larger than that of the second memory cell array.

5. The semiconductor memory device according to claim 1, wherein
each of the second memory cells is connected to a plurality of the first memory cells arranged in a corresponding column through a first bit-line pair, and amplifies and stores data to be written to or read from one of the first memory cells.

6. The semiconductor memory device according to claim 1, comprising:
a plurality of memory cell array parts comprising the first memory cell arrays and the second memory cell arrays, wherein
the plurality of memory cell array parts are adjacently arranged in the column direction.

7. The semiconductor memory device according to claim 6, wherein the plurality of memory cell array parts that are adjacent with each other are arranged with mirror inversion.

8. The semiconductor memory device according to claim 6, wherein
the memory cell array parts are separately arranged in two areas;
the separated two areas are arranged face to face in the column direction; and
the first memory cell array is arranged between the separated two areas.

9. The semiconductor memory device according to claim 1, wherein
the second memory cell array comprises a plurality of control cells corresponding to the second memory cell arranged as a matrix; and
the control cell is connected to a low-voltage-side power supply of the second memory cell corresponding thereto.

10. The semiconductor memory device according to claim 9, wherein the control cell is an inverter.

11. The semiconductor memory device according to claim 9, wherein the control cell is an NMOS transistor.

12. The semiconductor memory device according to claim 6, comprising:
a word line control circuit that outputs a first control signal to select the first memory cell and a second control signal to select the second memory cell, data being read from or written to the first memory cells;
a sense amplifier circuit that amplifies a difference of voltages of data to be input from the second memory cell to be selected through a second bit-line pair corresponding thereto and outputs an amplified signal as a reading signal in a reading operation; and
a writing control circuit outputting data to the second bit-line pair connected to the second memory cell to be selected based on a writing signal from outside in a writing operation.

13. The semiconductor memory device according to claim 12, wherein:
the word line control circuit outputs a third control signal controlling a pre-charge operation to a pre-charge transistor of the second memory cell and outputs a forth control signal controlling an activating operation to a low-voltage-side power supply terminal of the second memory cell.

14. The semiconductor memory device according to claim 12, wherein
the second memory cell array comprises a plurality of control cells corresponding to the second memory cell as a matrix; and
the control cell is connected to a low-voltage-side power supply of the second memory cell corresponding thereto.

15. The semiconductor memory device according to claim 14, wherein:
the word line control circuit outputs a third control signal controlling a pre-charge operation to a pre-charge transistor of the second memory cell and outputs a fifth control signal controlling an activating operation to the control cell.

\* \* \* \* \*